United States Patent [19]
Sagoh

[11] Patent Number: 5,894,443
[45] Date of Patent: Apr. 13, 1999

[54] STATIC SEMICONDUCTOR MEMORY DEVICE CAPABLE OF REDUCING PRECHARGING POWER DISSIPATION

[75] Inventor: Tomoe Sagoh, Tokyo, Japan

[73] Assignee: NEC Corporation, Tokyo, Japan

[21] Appl. No.: 08/956,000

[22] Filed: Oct. 22, 1997

[30] Foreign Application Priority Data

Oct. 23, 1996 [JP] Japan ................... 8-279777

[51] Int. Cl.$^6$ ................................... G11C 7/00
[52] U.S. Cl. .................. 365/203; 365/156; 365/230.03; 365/230.06
[58] Field of Search .................. 365/156, 230.03, 365/230.06, 203

[56] References Cited

U.S. PATENT DOCUMENTS

| 4,596,003 | 6/1986 | Shimizu | 365/189 |
| 5,592,414 | 1/1997 | Soneda et al. | 365/154 |

FOREIGN PATENT DOCUMENTS

60-69891  4/1985  Japan.

Primary Examiner—David Nelms
Assistant Examiner—VanThu Nguyen
Attorney, Agent, or Firm—Scully, Scott Murphy and Presser

[57] ABSTRACT

In a static semiconductor memory device including a plurality of groups of memory cells, a plurality of word lines, and a plurality of bit line pairs, a plurality of transfer gate circuits are provided. Each of the transfer gate circuits is connected between one group of the groups of memory cells and one of the bit line pairs, and is controlled by a voltage at one of the word lines.

7 Claims, 10 Drawing Sheets

Fig. 3A $\phi_{PRE}$
PRIOR ART
Fig. 3B

Fig. 7A  Φ_PRE 
Fig. 7B  WL1 
Fig. 7C  WL2 
Fig. 7D  Y1 
Fig. 7E  Y2 
Fig. 7F  Y3 (BL1, $\overline{BL1}$) 
Fig. 7G  Y4 (BL2, $\overline{BL2}$) 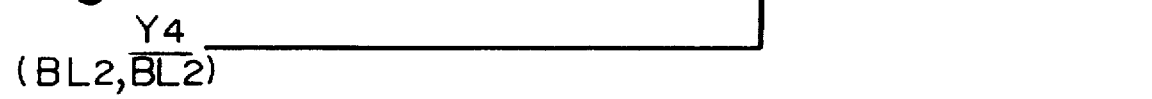
Fig. 7H  Y5 (BL3, $\overline{BL3}$) 
Fig. 7I  Y6 (BL4, $\overline{BL4}$) 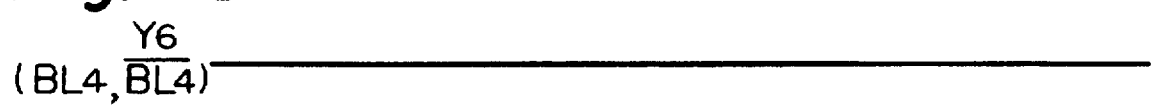
M11  M21  M13  M24

φ_PRE

WL1

WL2

Y1

Y2

Y3

Y4

Y5
(BL1, $\overline{BL1}$)

Y6
(BL2, $\overline{BL2}$)

M11  M21  M16  M26

STATIC SEMICONDUCTOR MEMORY DEVICE CAPABLE OF REDUCING PRECHARGING POWER DISSIPATION

BACKGROUND OF THE INVENTION

1. Field of the Invention

The present invention relates to a semiconductor memory device, and more particularly, to a static random access memory (SRAM) device.

2. Description of the Related Art

Generally, in an SRAM device which is constructed by flip-flop type memory cells arranged in rows and columns, and a plurality of word lines and a plurality of bit line pairs connected to the memory cells, a precharging operation needs to be carried out before an access operation such as a write operation or a read operation is carried out.

In a first prior art SRAM device, one of the word lines is connected to each row of the memory cells, and one of the bit line pairs is connected to each column of the memory cells. This will be explained later in detail.

In the above-mentioned first prior art SRAM device, however, since the number of bit lines is the same as that of columns of the memory cells, the number of bit lines precharged by each precharging operation is large. As a result, the power dissipation is increased.

In a second prior art SRAM device, two word lines are connected to each row of the memory cells, and each column of the memory cells is interposed between two adjacent bit lines. In this case, the number of bit lines is the number of columns of the memory cells plus 1. As a result, the number of bit lines precharged by each precharging operation is reduced, thus reducing the power dissipation. This will also be explained later in detail.

In the second prior art SRAM device, since the number of bit lines cannot be smaller than that of columns of the memory cells, the reduction of the power dissipation is limited.

SUMMARY OF THE INVENTION

It is an object of the present invention to further reduce the power dissipation due to a precharging operation in an SRAM device.

According to the present invention, in a static semiconductor memory device including a plurality of groups of memory cells, a plurality of word lines and a plurality of bit line pairs, a plurality of transfer gate circuits are provided. Each of the transfer gate circuits is connected between one group of the groups of memory cells and one of the bit line pairs and is controlled by a voltage at one of the word lines. That is, the number of bit lines is the same as the number of columns of the memory cell divided by the number of memory cells in one group of memory cells. For example, if one group of memory cells is formed by four memory cells, the number of bit lines is one fourth of the number of columns of memory cells.

Thus, the number of bit lines precharged by each precharging operation is reduced, which reduces the power dissipation.

BRIEF DESCRIPTION OF THE DRAWINGS

The present invention will be more clearly understood from the description as set forth below, in comparison with the prior art, with reference to the accompanying drawings, wherein:

FIGS. 3A and 3B are timing diagrams showing the operation of the device of FIG. 2;

FIGS. 7A through 7I are timing diagrams showing the operation of the device of FIG. 5;

DESCRIPTION OF THE PREFERRED EMBODIMENTS

Before the description of the preferred embodiments, prior art SRAM devices will be explained with reference to FIGS. 1, 2, 3A, 3B and 4.

Figure 1:
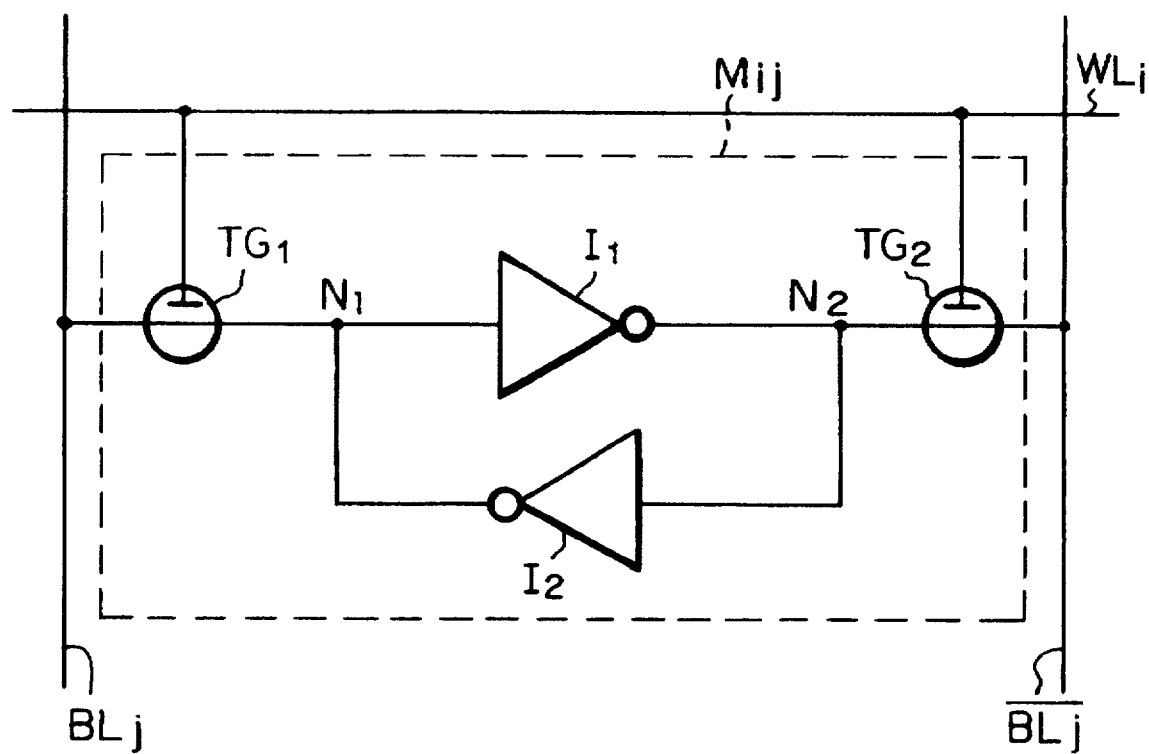
FIG. 1 is a circuit diagram illustrating one SRAM cell.

In FIG. 1, which illustrates one SRAM cell, one memory cell $M_{ij}$ is connected to one word line $WL_i$ and two complementary bit lines $BL_j$ and $\overline{BL_j}$. The memory cell $M_{ij}$ includes two inverters $I_1$ and $I_2$ forming a flip-flop connected between nodes $N_1$ and $N_2$, a transfer gate $TG_1$ connected between the node $N_1$ and the bit line $BL_j$, and a transfer gate $TG_2$ connected between the node $N_2$ and the bit line $\overline{BL_j}$.

In FIG. 1, assume that the voltages at the bit lines $BL_j$ and $\overline{BL_j}$ are high and low, respectively. In this state, when the voltage at the word line $WL_i$ is made high to turn ON the transfer gates $TG_1$ and $TG_2$, the voltages at the nodes $N_1$ and $N_2$ are made high and low, respectively, by the voltages at the bit lines $BL_j$ and $\overline{BL_j}$. Thus, data "0"(high level) is written into the memory cell $M_{ij}$.

On the other hand, assume that the voltages at the bit lines $BL_j$ and $\overline{BL_j}$ are low and high, the bit lines $BL_j$ and $\overline{BL_j}$ are low and high, respectively. In this state, when the voltage at the word line $WL_i$ is made high to turn ON the transfer gates $TG_1$ and $TG_2$, the voltages at the nodes $N_1$ and $N_2$ are made low and high, respectively, by the voltages at the bit lines $BL_j$ and $\overline{BL_j}$. Thus, data "1"(low level) is written into the memory cell $M_{ij}$.

Also, after the bit lines $BL_j$ and $\overline{BL_j}$ are precharged to a predetermined voltage, when the voltage at the word line $WL_i$ is made high, the charges at the nodes $N_1$ and $N_2$ flow to the bit lines $BL_j$ and $\overline{BL_j}$, respectively. As a result, the data stored in the memory cell $M_{ij}$ is read out to the bit lines $BL_j$ and $\overline{BL_j}$.

Further, when the voltage at the word line $WL_i$ is low, the data of the memory cell $M_{ij}$ is maintained at the memory cell $M_{ij}$.

Figure 2:
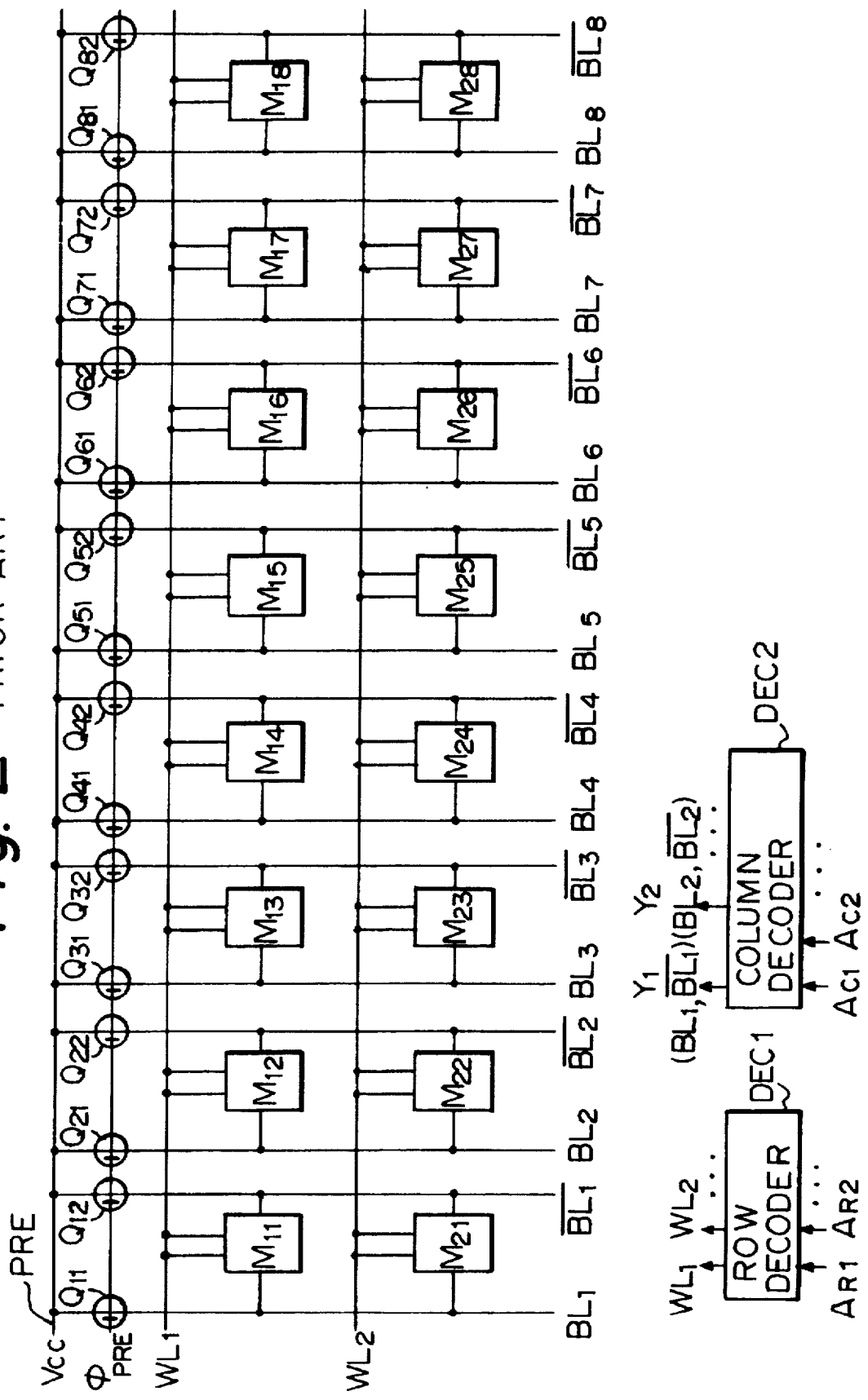
FIG. 2 is a circuit diagram illustrating a first prior art SRAM device.

In FIG. 2, which illustrates a first prior art SRAM device, memory cells $M_{11}, M_{12}, ---, M_{18}, M_{21}, M_{22}, ---, M_{28}$ each having the same configuration as illustrated in FIG. 1 are connected to word lines $WL_1$ and $WL_2$ and bit lines $BL_1$, $\overline{BL_1}$, $BL_2$, $\overline{BL_2}$, ---, $BL_8$, $\overline{BL_8}$. For example, the memory cell $M_{11}$ is connected to the word line $WL_1$ and the bit lines $BL_1$ and $\overline{BL_1}$. Also, the bit lines $BL_1$, $\overline{BL_1}$, $BL_2$, $\overline{BL_2}$, ---, $BL_8$, $\overline{BL_8}$ are connected via precharging transistors $Q_{11}$, $Q_{12}$, $Q_{21}$, $Q_{22}$, - - -, $Q_{81}$, $Q_{82}$ to a precharging line PRE whose voltage is $V_{cc}$. The precharging transistors $Q_{11}$, $Q_{12}$, $Q_{21}$, $Q_{22}$, - - -, $Q_{81}$, $Q_{82}$ are turned ON by a precharging signal $\varphi_{PRE}$.

Also, in FIG. 2, a row decoder DEC1 receives row address signals $A_{R1}$, $A_{R2}$, - - - to select one of the word lines $WL_1$, $WL_2$, - - -, and a column decoder DEC2 receives column address signals $A_{c1}$, $A_{c2}$, - - - to generate one of column selection signals $Y_1$, $Y_2$, - - -, thus selecting one pair of the bit lines such as $BL_1$ and $\overline{BL_1}$. Note that the column selection signal such as $Y_1$ turns ON column selection transistors (not shown), so that the bit line pair such as $BL_1$ and $\overline{BL_1}$ are connected to data bus lines (not shown).

The operation of the device of FIG. 2 is shown in FIGS. 3A and 3B. That is, before an access operation such as a write operation or a read operation is carried out by using addresses ADD1, ADD2, - - - as shown in FIG. 3B and defined by the row address signals $A_{R1}$, $A_{R2}$, - - - and the column address signals $A_{c1}$, $A_{c2}$, - - - -, a precharging operation is carried out as shown in FIG. 3A.

In FIG. 2, however, one word line is connected to each memory cell row, and one bit line pair, i.e., two bit lines are connected to each memory cell column. For example, in FIG. 2, sixteen bit lines are charged by each precharging operation. As a result, the number of bit lines precharged by each precharging operation is large. This increases the power dissipation.

Figure 4:
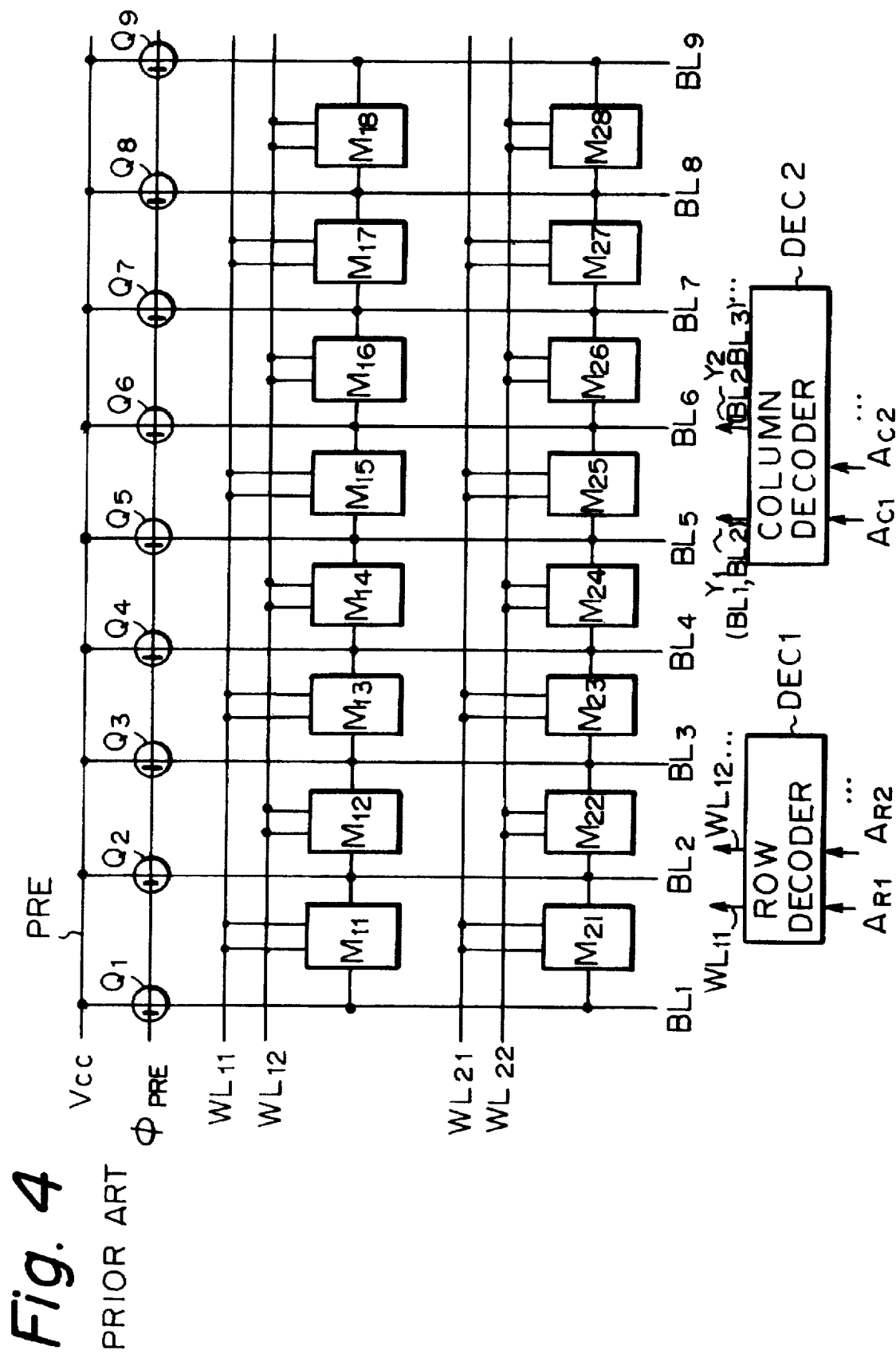
FIG. 4 is a circuit diagram illustrating a second prior art SRAM device.

In FIG. 4, which illustrates a second prior art SRAM device (see: JP-A-60-69891), two word lines $WL_{11}$ and $WL_{12}$ are provided instead of the one word line $WL_1$ of FIG. 2, and two word lines $WL_{21}$ and $WL_{22}$ are provided instead of the word line $WL_2$ of FIG. 2. The memory cells $M_{11}$, $M_{13}$, - - -, $M_{17}$ are connected to the word line $WL_{11}$, and the memory cells $M_{12}$, $M_{14}$, - - -, $M_{18}$ are connected to the word line $WL_{12}$. Similarly, the memory cells $M_{21}$, $M_{23}$, - - -, $M_{27}$ are connected to the word line $WL_{21}$, and the memory cells $M_{22}$, $M_{24}$, - - -, $M_{28}$ are connected to the word line $WL_{22}$.

Also, only nine bit lines $BL_1$, $BL_2$, - - -, $BL_9$ are provided instead of the sixteen bit lines of FIG. 2, and accordingly, only nine precharging transistors $Q_1$, $Q_2$, - - -, $Q_9$ are provided instead of the sixteen precharging transistors of FIG. 2. In this case, the bit lines $BL_2$, $BL_3$, - - -, $BL_8$ are used commonly for two adjacent memory cell columns.

Also, in FIG. 4, a row decoder DEC1 receives row address signals $A_{R1}$, $A_{R2}$, - - - to select one of the word lines $WL_{11}$, $WL_{12}$, - - -, and a column decoder DEC2 receives column address signals $A_{c1}$, $A_{c2}$, to generate one of column selection signals $Y_1$, $Y_2$, - - -, to select one pair of the bit lines such as $BL_1$ and $BL_2$.

The operation of the device of FIG. 4 is also shown in FIGS. 3A and 3B. That is, before an access operation such as a write operation or a read operation is carried out by using addresses ADD1, ADD2, - - - as shown in FIG. 3B and defined by the row address signals $A_{R1}$, $A_{R2}$, - - - and the column address signals $A_{c1}$, $A_{c2}$, - - - -, a precharging operation is carried out as shown in FIG. 3A.

In FIG. 4, two word lines are connected to each memory cell row, and one bit line is connected to each memory cell column. Precisely, the number of bit lines is the number of memory cell columns plus one. For example, in FIG. 4, nine bit lines are charged by each precharging operation. As a result, the number of bit lines precharged by each precharging operation is small. This decreases the power dissipation.

In the device of FIG. 4, however, since the number of bit lines cannot be smaller than that of columns of the memory cells, the reduction of power dissipation is limited.

Figure 5:
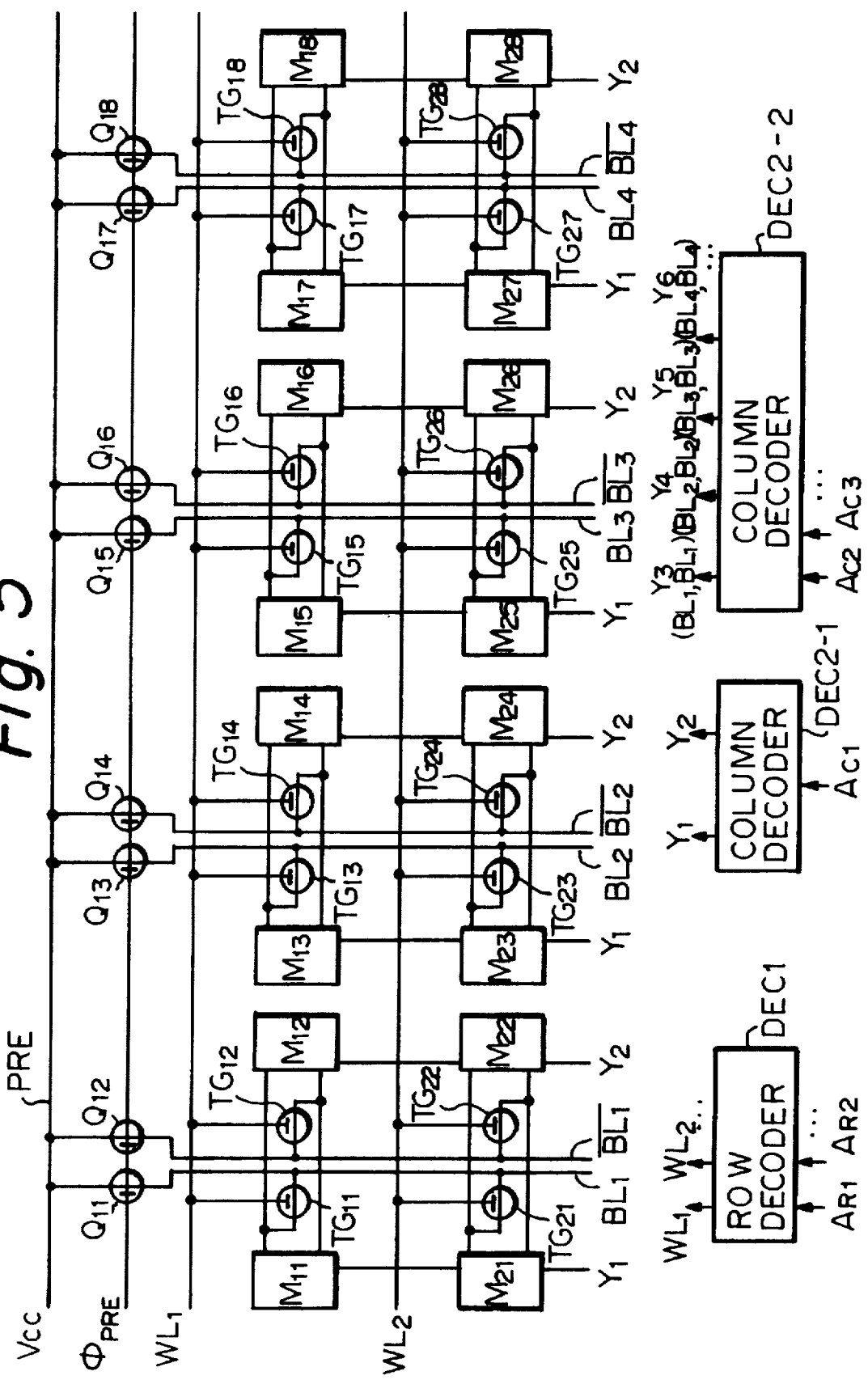
FIG. 5 is a circuit diagram illustrating a first embodiment of the SRAM device according to the present invention.

In FIG. 5, which illustrates a first embodiment of the present invention, one bit line pair such as bit lines $BL_1$ and $\overline{BL_1}$ are provided for two memory cell columns such as a column of the memory cells $M_{11}$ and $M_{21}$ and a column of the memory cells $M_{12}$ and $M_{22}$. Also, the memory cells $M_{11}$, $M_{12}$, - - -, $M_{18}$, $M_{21}$, $M_{22}$, - - -, $M_{28}$ are classed in groups each formed by two memory cells. In this case, transfer gates are commonly provided for the memory cells of each group. For example, transfer gates $TG_{11}$ and $TG_{12}$ are commonly provided for the memory cells $M_{11}$ and $M_{12}$, and are connected between the group of the memory cells $M_{11}$ and $M_{12}$ and the bit lines $BL_1$ and $\overline{BL_1}$. The transfer gates $TG_{11}$ and $TG_{12}$ are controlled by the voltage at the word line $WL_1$.

Also, in FIG. 5, a row decoder DEC1 receives row address signals $A_{R1}$, $A_{R2}$, - - - to select one of the word lines $WL_1$, $WL_2$, - - -. A column decoder DEC2-1 receives a column address signal $A_{c1}$ to generate one of column selection signals $Y_1$ and $Y_2$, thus selecting one memory cell from each of the memory cell groups. A column decoder DEC2-2 receives column address signals $A_{c2}$, $A_{c3}$, - - - to generate one of column selection signals $Y_3$, $Y_4$, - - -, thus selecting one pair of the bit lines such as $BL_1$ and $\overline{BL_1}$.

In FIG. 5, only the eight bit lines $BL_1$, $\overline{BL_1}$, $BL_2$, $\overline{BL_2}$, - - -, $BL_4$, $\overline{BL_4}$ are provided, and accordingly, only eight precharging transistors $Q_{11}$, $Q_{12}$, $Q_{13}$, $Q_{14}$, - - -, $Q_{17}$ and $Q_{18}$ are provided.

Figure 6:
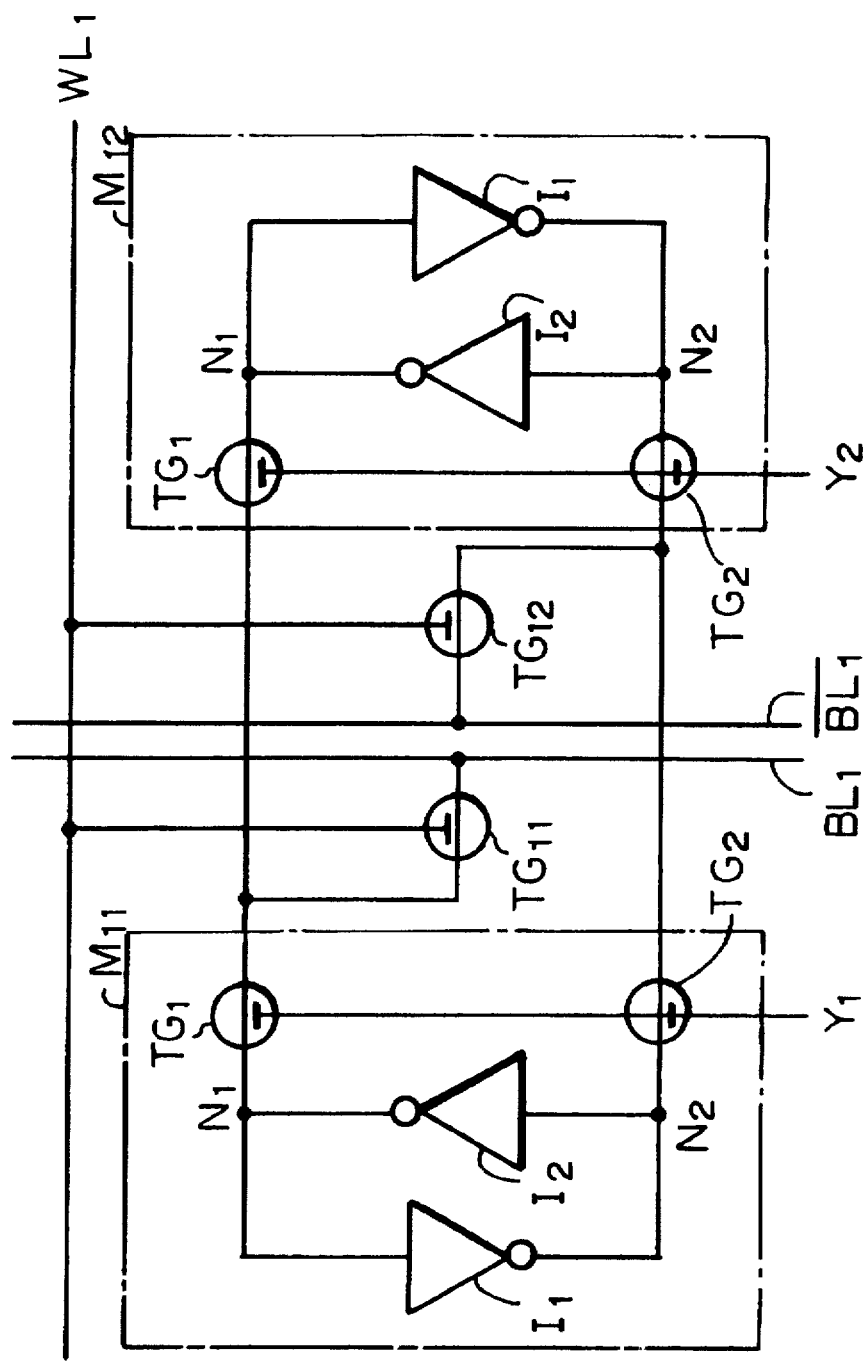
FIG. 6 is a partial detailed circuit diagram of the SRAM device of FIG. 5.

In FIG. 6, which is a partial detailed circuit diagram of the memory cell $M_{11}$ and $M_{12}$ of FIG. 5, each of the memory cells $M_{11}$ and $M_{12}$ has the same configuration as the memory cell of FIG. 1. However, the transfer gates $TG_1$ and $TG_2$ of the memory cell $M_{11}$ are controlled by the column selection signal $Y_1$, not by the voltage at the word line $WL_1$. Similarly, the transfer gates $TG_1$ and $TG_2$ of the memory cell $M_{12}$ are controlled by the column selection signal $Y_2$, not by the voltage at the word line $WL_1$. Also, the memory cells $M_{11}$ and $M_{12}$ are connected to the bit lines $BL_1$ and $\overline{BL_1}$ via the transfer gates $TG_{11}$ and $TG_{12}$ controlled by the voltage at the word line $WL_1$.

The operation of the device of FIG. 5 is shown in FIGS. 7A through 7I. That is, as shown in FIG. 7A, before an access operation such as a write operation or a read operation is carried out, a precharging operation is carried out.

For example, if $WL_1$="1", $WL_2$="0", $Y_1$="1", $Y_2$="0", $Y_3$="1" and $Y_4$=$Y_5$=$Y_6$="0", the memory cell $M_{11}$ is accessed. If $WL_1$="0", $WL_2$="1", $Y_1$="1", $Y_2$="0", $Y_3$="1" and $Y_4$=$Y_5$=$Y_6$="0", the memory cell $M_{21}$ is accessed. If $WL_1$="1", $WL_2$="0", $Y_1$="0", $Y_2$="1", $Y_3$="0", $Y_4$="1" and $Y_5$=$Y_6$="0", the memory cell $M_{13}$ is accessed. If $WL_1$="0", $WL_2$="1", $Y_1$="0", $Y_2$="1", $Y_3$="0", $Y_4$="1" and $Y_5$=$Y_6$="0", the memory cell $M_{24}$ is accessed.

In FIG. 5, one word line is connected to each memory cell row, and one bit line is connected to each memory cell column. For example, in FIG. 5, eight bit lines are charged by each precharging operation. As a result, the number of bit lines precharged by each precharging operation is smaller as compared with the second prior art device. This further decreases the power dissipation.

Figure 8:
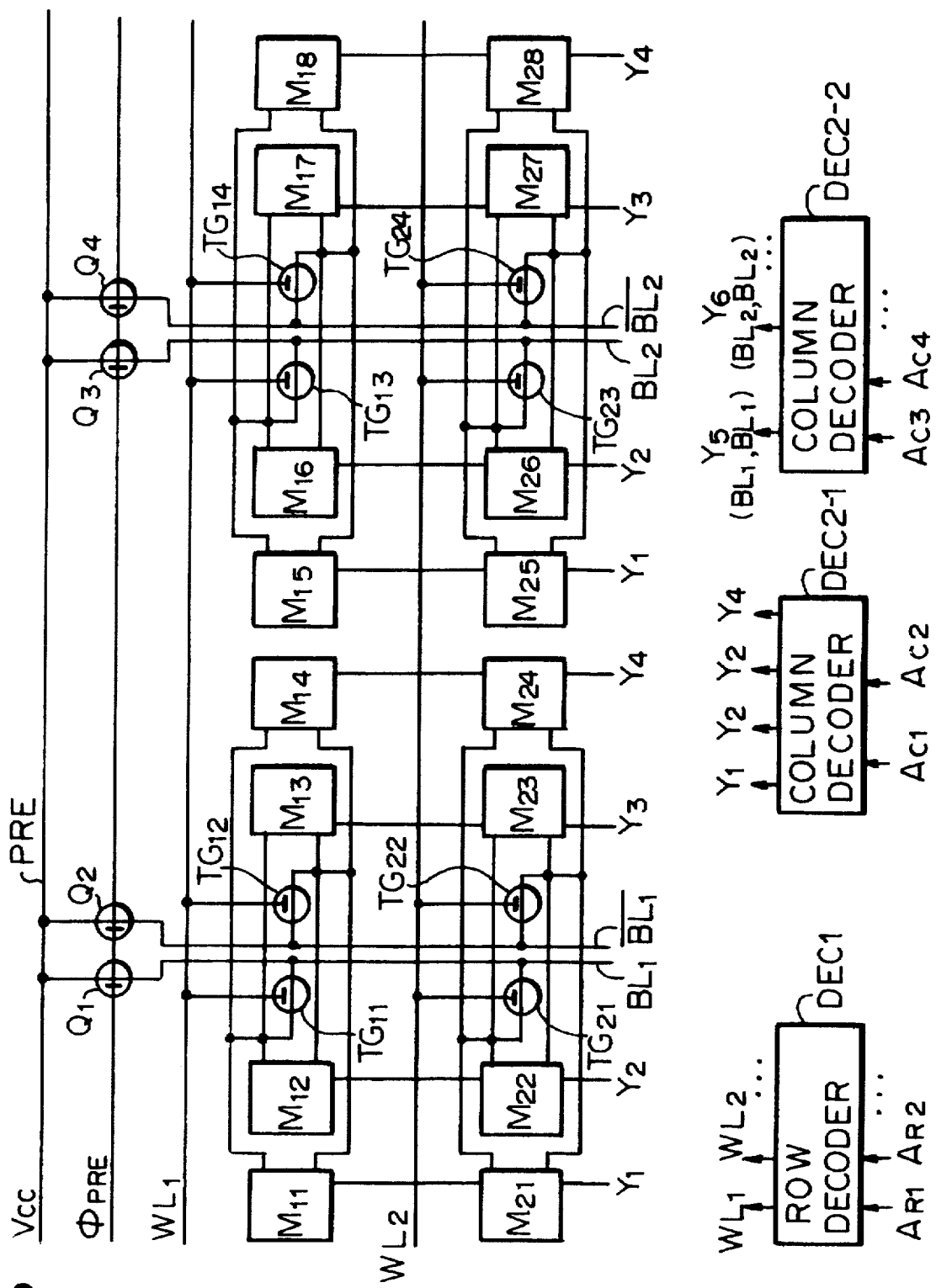
FIG. 8 is a circuit diagram illustrating a second embodiment of the SRAM device according to the present invention.

In FIG. 8, which illustrates a second embodiment of the present invention, one bit line pair such as bit lines $BL_1$ and $\overline{BL_1}$ are provided for four memory cell columns such as a column of the memory cells $M_{11}$ and $M_{21}$, a column of the memory cells $M_{12}$ and $M_{22}$, a column of the memory cells $M_{13}$ and $M_{23}$, and a column of the memory cells $M_{14}$ and $M_{24}$. Also, the memory cells $M_{11}$, $M_{12}$, - - -, $M_{18}$, $M_{21}$, $M_{22}$, - - -, $M_{28}$ are classed in groups each formed by four memory cells. In this case, transfer gates are commonly provided for the memory cells of each group. For example, transfer gates $TG_{11}$ and $TG_{12}$ are commonly provided for the memory cells $M_{11}$, $M_{12}$, $M_{13}$ and $M_{14}$, and are connected between the group of the memory cells $M_{11}$, $M_{12}$, $M_{13}$ and $M_{14}$ and the bit lines $BL_1$ and $\overline{BL_1}$. The transfer gates $TG_{11}$ and $TG_{12}$ are controlled by the voltage at the word line $WL_1$.

Also, in FIG. 8, a row decoder DEC1 receives row address signals $A_{R1}$, $A_{R2}$, - - - to select one of the word lines $WL_1$, $WL_2$, - - - . A column decoder DEC2-1 receives column address signals $A_{c1}$ and $A_{c2}$ to generate one of column selection signals $Y_1$, $Y_2$, $Y_3$ and $Y_4$, thus selecting one memory cell from each of the memory cell groups. A column decoder DEC2-2 receives column address signals $A_{c3}$, $A_{c4}$, to generate one of column selection signals $Y_5$, $Y_6$, - - - , thus selecting one pair of the bit lines such as $BL_1$ and $\overline{BL_1}$.

In FIG. 8, only the four bit lines $BL_1$, $\overline{BL_1}$, $BL_2$ and $\overline{BL_2}$ are provided, and accordingly, only four recharging transistors $Q_1$, $Q_2$, $Q_3$ and $Q_4$ are provided.

Figure 9:
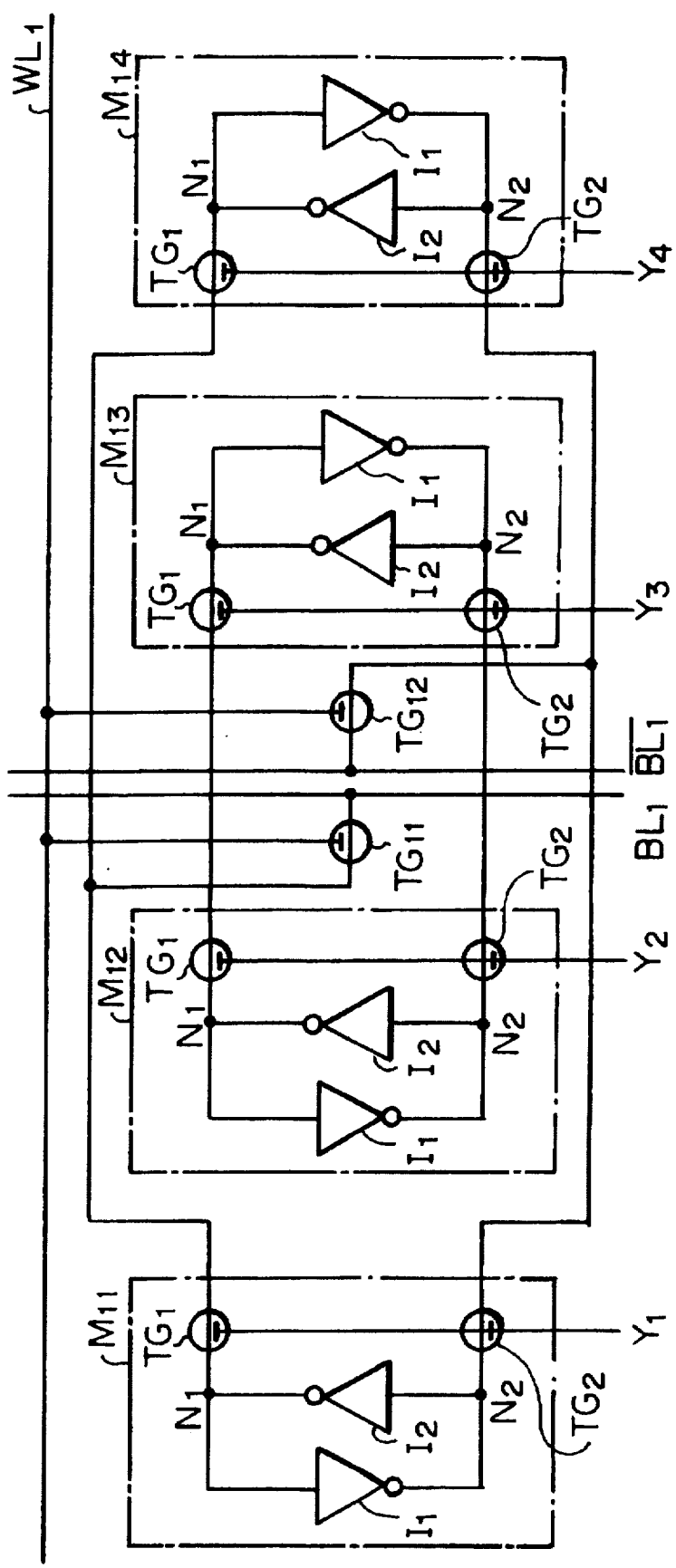
FIG. 9 is a partial detailed circuit diagram of the SRAM device of FIG. 8.

In FIG. 9, which is a partial detailed circuit diagram of the memory cell $M_{11}$, $M_{12}$, $M_{13}$ and $M_{14}$ of FIG. 8, each of the memory cells $M_{11}$, $M_{12}$, $M_{13}$ and $M_{14}$ has the same configuration as the memory cell of FIG. 1. However, the transfer gates $TG_1$ and $TG_2$ of the memory cell $M_{11}$ are controlled by the column selection signal $Y_1$, not by the voltage at the word line $WL_1$. Similarly, the transfer gates $TG_1$ and $TG_2$ of the memory cell $M_{12}$ are controlled by the column selection signal $Y_2$, not by the voltage at the word line $WL_1$. Also, the transfer gates $TG_1$ and $TG_2$ of the memory cell $M_3$ are controlled by the column selection signal $Y_3$, not by the voltage at the word line $WL_1$. Similarly, the transfer gates $TG_1$ and $TG_2$ of the memory cell $M_{14}$ are controlled by the column selection signal $Y_4$, riot by the voltage at the word line $WL_1$. Also, the memory cells $M_{11}$, $M_{12}$, $M_{13}$ and $M_{14}$ are connected to the bit lines $BL_1$ and $\overline{BL_1}$ via the transfer gates $TG_{11}TG_{12}$ controlled by the voltage at the word line $WL_1$.

Figure 10A:
FIGS. 10A through 10I are timing diagrams showing the operation of the device of FIG. 8.
Figure 10B:
Figure 10C:
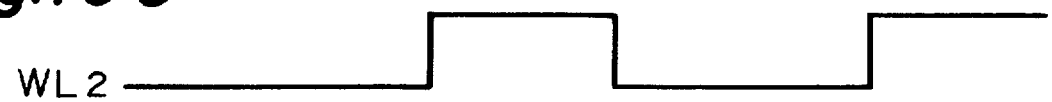
Figure 10D:
Figure 10E:
Figure 10F:
Figure 10G:
Figure 10H:
Figure 10I:
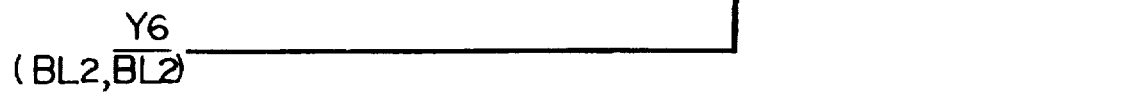

The operation of the device of FIG. 8 is shown in FIGS. 10A through 10L. That is, as shown in FIG. 10A, before an access operation such as a write operation or a read operation is carried out, a precharging operation is carried out.

For example, if $WL_1$="1", $WL_2$="0", $Y_1$="1", $Y_2$="0", $Y_3$=$Y_4$="0", $Y_5$="1" and $Y_6$="0", the memory cell $M_{11}$ is accessed. If $WL_1$="0", $WL_2$="1", $Y_1$="1", $Y_2$=$Y_3$=$Y_4$="0", $Y_5$="1" and $Y_6$="0", the memory cell $M_{21}$ is accessed. If $WL_1$="1", $WL_2$="0", $Y_1$="0", $Y_2$="0", $Y_3$=$Y_4$=$Y_5$="0", $Y_6$="0", the memory cell $M_{16}$ is accessed. If $WL_1$="0", $WL_2$="1", $Y_1$="0", $Y_2$="1", $Y_3$=$Y_4$=$Y_5$="0" and $Y_6$="1", the memory cell $M_{26}$ is accessed.

In FIG. 8, one word line is connected to each memory cell row, and one bit line is connected to each two memory cell columns. For example, in FIG. 8, four bit lines are charged by each precharging operation. As a result, the number of bit lines precharged by each precharging operation is much smaller as compared with the second prior art device. This further decreases the power dissipation. Note that the power dissipation in the second embodiment can be reduced to about half of that in the first embodiment.

In the above-mentioned embodiments, if an address is defined by the row address signals as lower bits and by the column address signals as upper bits, when this address is sequentially changed, the power dissipation can be minimal, since the transitions of the column address signals is reduced.

As explained hereinabove, according to the present invention, since the number of bit lines precharged by one precharging operation is reduced without substantially reducing the integration, the power dissipation can be reduced.

I claim:

1. A static semiconductor memory device comprising:

a plurality of groups of memory cells, with each group of memory cells comprising a plurality of memory cells;

a plurality of word lines;

a plurality of bit line pairs;

a plurality of transfer gate means, each connected between one group of said groups of memory cells and one of said bit line pairs, each of said transfer gate means being controlled by a voltage at one of said word lines;

a first selecting means, connected to said word lines, for selecting one of said word lines;

a second selecting means, connected to said memory cells, for selecting one memory cell from the plurality of memory cells in each of said group of memory cells; and a third selecting means, connected to said bit line pairs, for selecting one pair of said plurality of bit line pairs.

2. The device as set forth in claim 1, wherein each of said memory cells comprises:

first and second nodes;

a first inverter having an input connected to said second node and an output connected to said first node;

a second inverter having an input connected to said first node and an output connected to said second node;

a first transfer gate connected between said first node and one of said transfer gate means; and a second transfer gate connected between said second node and one of said transfer gate means.

3. The device as set forth in claim 1, further comprising a plurality of precharging circuits each connected to one bit line of said bit line pairs.

4. A static semiconductor memory device comprising:

a plurality of memory cells in rows and columns;

a plurality of word lines, each word line provided for one row of said memory cells;

a plurality of bit line pairs, each bit line pair provided for a plurality of columns of said memory cells;

a plurality of transfer gate means, each transfer gate means being connected between a row of said plurality of columns of memory cells and one of said bit line pairs, each of said transfer gate means being controlled by a voltage at one of said word lines.

5. The device as set forth in claim 4, further comprising:

a first selecting means, connected to said word lines, for selecting one of said word lines;

a second selecting means, connected to said memory cells, for selecting one memory cell column from each of said plurality of columns memory cells; and a third selecting means, connected to said bit line pairs, for selecting one pair of said plurality of bit line pairs.

6. The device as set forth in claim 4, wherein each of said memory cells comprises:

first and second nodes;

a first inverter having an input connected to said second node and an output connected to said first node;

a second inverter having an input connected to said first node and an output connected to said second node;

a first transfer gate connected between said first node and one of said transfer gate means; and a second transfer gate connected between said second node and one of said transfer gate means.

7. The device as set forth in claim 4, further comprising a plurality of precharging circuits each connected to one bit line of said bit line pairs.

* * * * *

UNITED STATES PATENT AND TRADEMARK OFFICE
CERTIFICATE OF CORRECTION

PATENT NO. : 5,894,443
DATED : August 13, 1999
INVENTOR(S) : Tomoe Sagoh

It is certified that error appears in the above-identified patent and that said Letters Patent is hereby corrected as shown below:

Column 3, Line 48: "$Ac_1$, $Ac_2$, to" should read --$Ac_1$, $Ac_2$,-- to--

Column 5, Line 14: "$Ac_3$, $Ac_4$, to" should read --$Ac_1$, $Ac_2$,-- to--

Column 5, Line 34: "$Y_4$, riot" should read --$Y_4$, not--

On The Title Page, [56] FOREIGN PATENT DOCUMENTS: Insert --54-107227 8/1979 Japan--

Signed and Sealed this

Twentieth Day of June, 2000

Q. TODD DICKINSON

*Attest:*

*Attesting Officer*          *Director of Patents and Trademarks*